United States Patent [19]
Jezorek et al.

[11] 4,267,214
[45] May 12, 1981

[54] METHOD AND APPARATUS FOR BROMINATING TACKY SURFACES OF A PHOTOPOLYMER ARTICLE

[75] Inventors: Leigh Jezorek, Somerville; Irving Pitel, Edison; Richard Silverman, Clark, all of N.J.

[73] Assignee: Kelleigh Corporation, Avenel, N.J.

[21] Appl. No.: 76,787

[22] Filed: Sep. 18, 1979

[51] Int. Cl.³ .............................................. B05D 3/10
[52] U.S. Cl. .................................. 427/341; 118/429; 134/10; 134/42; 427/400
[58] Field of Search ........................... 134/10, 38, 42; 427/341, 400; 430/327; 118/429

[56] References Cited

U.S. PATENT DOCUMENTS

| | | | |
|---|---|---|---|
| 3,476,600 | 11/1969 | Morgan et al. | 134/25 A X |
| 3,802,912 | 4/1974 | Otocka | 427/400 |
| 3,968,316 | 7/1976 | Jyo et al. | 427/400 X |
| 4,087,370 | 5/1978 | Singalewitch et al. | 134/38 X |
| 4,144,093 | 3/1979 | Reinwald et al. | 134/25 A X |

*Primary Examiner*—Marc L. Caroff
*Attorney, Agent, or Firm*—Ronald G. Goebel

[57] ABSTRACT

Tacky portions of the surface of a photopolymer article, such as a photopolymer printing plate, are treated by immersing the photopolymer article in an aqueous solution of bromine and circulating the solution across the photopolymer article and through an ion-exchange resin to which elemental bromine has been added.

7 Claims, 2 Drawing Figures

METHOD AND APPARATUS FOR BROMINATING TACKY SURFACES OF A PHOTOPOLYMER ARTICLE

BACKGROUND OF THE INVENTION

The invention relates generally to devices for treating photopolymer articles, and relates specifically to an apparatus for and method of treating the surface of a photopolymer article to remove tacky portions therefrom.

In processing a photopolymer article, such as a photopolymer printing plate, oxygen is abundant at the surface thereof, which inhibits cross-linking reaction.

The uncross-linked sites create tacky portions on the surface of the photo-polymer article.

Such tacky portions of the surface result in difficulty in storage of the photopolymer article, as such portions of the surface pick up foreign substances, and change the characteristics of the surface of the photopolymer article in use, interfering with operation thereof.

Presently, devices for treating photopolymer articles utilize a bleach, to which hydrochloric acid is added to react therewith, to lower the pH thereof, and to generate chlorine, which chlorine reacts with the tacky portions of the surface of the photopolymer article to remove the tacky surface.

In operating such devices, the operator is handling dangerous chemicals, and subsequently producing toxic lethal chemicals. The active chemical produced lasts a relatively short time, and the concentration of such active chemical is continually changing. Such treatment of the surface of photopolymer articles is therefore dangerous to the operator, and the time and concentration dependence and variability thereof makes such devices highly inefficient and ineffective.

SUMMARY OF THE INVENTION

In view of the above, one of the objects of the invention is to provide an apparatus for and method of treating the surface of a photopolymer article to remove tacky portions therefrom in a safe, efficient and effective manner.

The above objects, as well as others, are provided for in the invention by means of an apparatus for and method of treating the surface of a photopolymer article to remove tacky portions therefrom. The apparatus comprises means for coreacting bromine with the tacky portions of the surface of the photopolymer article. The method comprises the step of coreacting bromine with the tacky portions of the surface of the photopolymer article.

DESCRIPTION OF THE DRAWINGS

The invention is illustrated in the accompanying drawings, by way of example thereof, wherein.

DESCRIPTION OF THE PREFERRED EMBODIMENT

Figure 2:
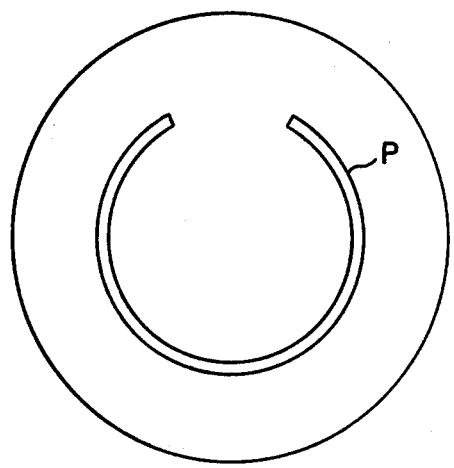
FIG. 2 is a top plan view thereof.
Figure 1:
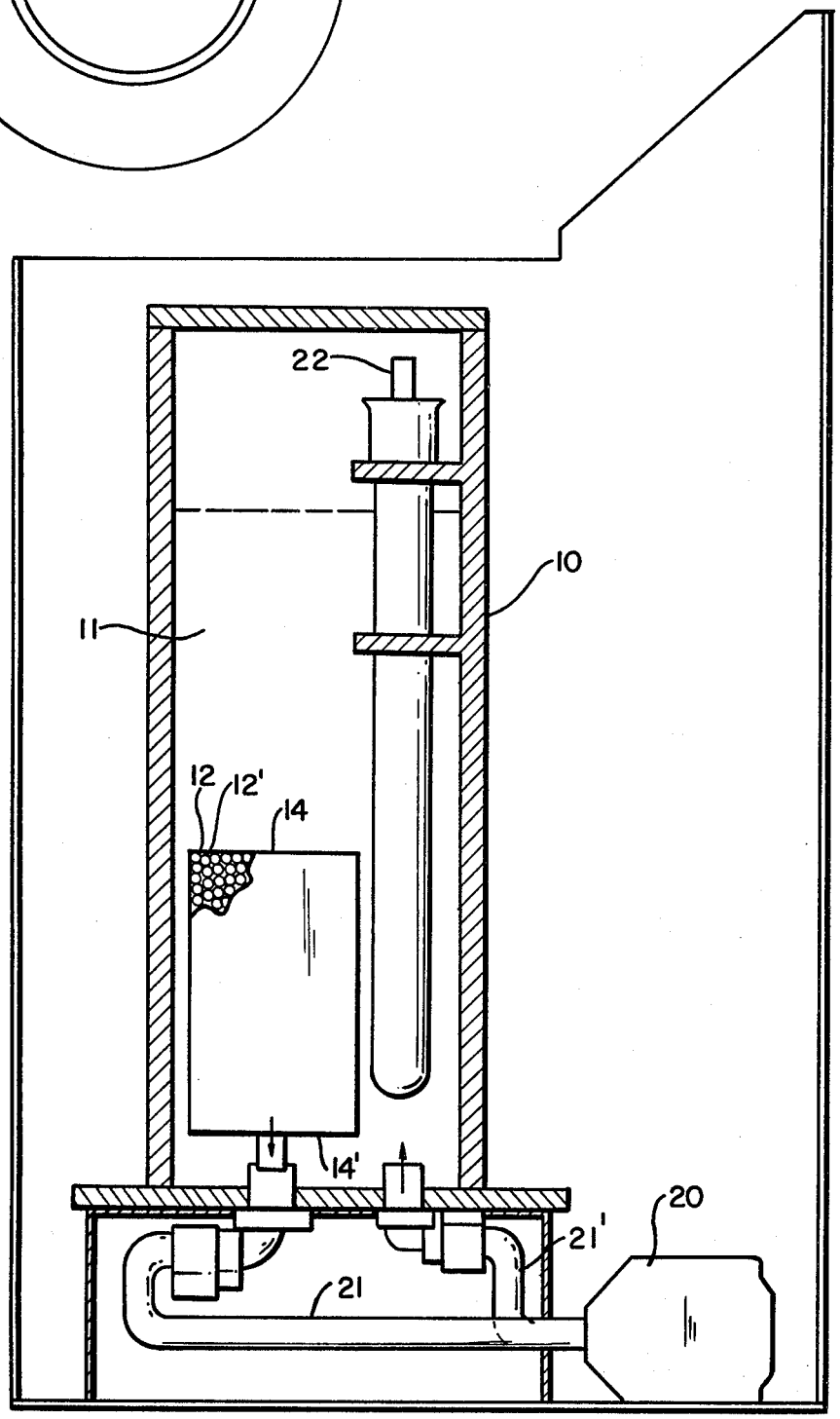
FIG. 1 is a side elevational, partly cross-sectional view of the apparatus, with the photopolymer article therein, pursuant to the invention.

The invention comprises an apparatus for and method of treating the surface of a photopolymer article to remove tacky portions therefrom.

In the preferred embodiment of the invention, as illustrated in the Figures, the apparatus comprises, for example, means for coreacting bromine with the tacky portions of the surface of photopolymer article P, as a photopolymer printing plate, comprising a housing 10, means for providing bromine for coreaction with the tacky portions of the surface of the photopolymer article P, supportable in the housing 10, means for supporting the providing means in the housing 10, and a solution 11, which substantially fills the inside of the housing 10, such that the providing means, supporting means, and photopolymer article P are substantially immersed therein, for coreacting with the bromine and the tacky portions of the surface of the photopolymer article P.

The providing means comprise beads, as 12, 12', comprised of an ion exchange resin to which elemental bromine has been added.

The supporting means comprise cartridge 13, which includes screens 14, 14' at each end thereof.

The solution 11 comprises an aqueous media of active compounds of water and bromine.

The apparatus further includes means for circulating the solution 11 in the housing 10, and means for sensing the temperature of the solution 11.

The circulating means comprise pump 20, and means for connecting the pump 20 to the housing, comprising pipes 21, 21' interconnecting cartridge 13, solution 11, and pump 20. The sensing means comprise thermometer 22.

In operation, the bromine is in equilibrium with the resin and water in the aqueous media solution 11. As the bromine in the continuous phase water is depleted, through reaction with the tacky surface of the photopolymer article P, additional bromine is released by the resin in beads, as 12, 12', to reestablish the equilibrium condition. The photopolymer article P is retained in the solution 11 for a period of time dependent upon the temperature of the solution as measured by thermometer 22. The pump 20 recirculates solution 11 about the photopolymer plate P and through beads, as 12, 12'. After the appropriate time has passed, the photopolymer article P is removed from solution 11 with the tacky surface eliminated therefrom. The method comprises, for example, the step of coreacting bromine with the tacky portions of the surface of photopolymer article P, comprising substantially immersing the photopolymer article P, means for providing bromine for coreaction with the tacky portions of the surface of the photopolymer article P, and means for supporting the providing means, in solution 11, for coreacting the bromine and the tacky portions of the surface of the photopolymer article P.

The bromine is removed from the ion exchange resin in the beads, as 12, 12', in a controlled equilibrium reaction, in which the concentration of resin and water remain constant at constant temperature, and the concentration of bromine in solution 11 is constant.

The bromine has a low depletion rate, and generates a longlasting solution.

The solution is ready to be used at any time, without the necessity for the operator to handle dangerous chemicals, and is useful over an extended period of time, with the temperature thereof controlling the amount of reagent bromine in solution, such that elimination of the tacky surface of the photopolymer article is provided in a safe, efficient and effective manner.

The preferred embodiment of the invention has been set forth above. It is to be understood, however, that variations may be made in such preferred embodiment, which may nevertheless be within the scope and spirit of the invention. The invention, therefore, is to be broadly construed, within the scope and spirit of the claims herein.

We claim:

1. An apparatus for treating the tacky portions of the surface of a photopolymer article comprising:
   (a) a housing having an inside chamber for containing an aqueous solution of bromine; said photopolymer article being immersible in said solution;
   (b) a cartridge located in said chamber, said cartridge containing an ion-exchange resin to which elemental bromine has been added;
   (c) means for retaining said ion exchange resin in said cartridge; and
   (d) means for circulating said solution across said photopolymer article surface and through said cartridge.

2. The apparatus of claim 1 wherein said means for retaining said ion-exchange resin comprises a pair of screens located at opposite ends of said cartridge.

3. The apparatus of claim 1 wherein said circulating means comprises a pump.

4. The apparatus of claim 1 which further comprises means located in said chamber for sensing the temperature of said solution.

5. An apparatus for treating the tacky portions of the surface of a photopolymer article comprising:
   (a) a housing having an inside chamber for containing an aqueous solution of bromine and water; said photopolymer article being immersible in said solution;
   (b) a cartridge located in said chamber, said cartridge containing an ion-exchange resin to which elemental bromine has been added;
   (c) a pair of screens for retaining said ion-exchange resin in said cartridge located at opposite ends of said cartridge;
   (d) means for conducting said solution from and to said chamber; and
   (e) a pump connected with said conducting means for circulating said solution across said photopolymer article surface and through said cartridge.

6. The apparatus of claim 5 which further comprises means located in said chamber for sensing the temperature of said solution.

7. A method for treating the tacky portions of the surface of a photopolymer article comprising:
   (a) immersing said photopolymer article in a zone containing an aqueous solution of bromine and an ion-exchange resin to which elemental bromine has been added; and
   (b) circulating said solution across said tacky photopolymer article surface and through said ion-exchange resin.

* * * * *